United States Patent
Miyoshi et al.

(10) Patent No.: US 12,225,364 B2
(45) Date of Patent: Feb. 11, 2025

(54) SPEAKER DEVICE AND CONTROL METHOD THEREOF

(71) Applicant: Roland Corporation, Shizuoka (JP)

(72) Inventors: Naoshi Miyoshi, Shizuoka (JP); Masato Ueno, Shizuoka (JP)

(73) Assignee: Roland Corporation, Shizuoka (JP)

( * ) Notice: Subject to any disclaimer, the term of this patent is extended or adjusted under 35 U.S.C. 154(b) by 228 days.

(21) Appl. No.: 17/952,321

(22) Filed: Sep. 26, 2022

(65) Prior Publication Data

US 2023/0209266 A1    Jun. 29, 2023

(30) Foreign Application Priority Data

Dec. 28, 2021  (JP) ................. 2021-215108

(51) Int. Cl.
*H04R 5/02*  (2006.01)
*H04R 5/04*  (2006.01)
*H04S 1/00*  (2006.01)
*H04S 7/00*  (2006.01)

(52) U.S. Cl.
CPC .............. *H04R 5/04* (2013.01); *H04R 5/02* (2013.01); *H04S 1/007* (2013.01); *H04S 7/307* (2013.01)

(58) Field of Classification Search
CPC .. H04R 5/04; H04R 5/02; H04S 1/007; H04S 7/307
USPC ................................... 381/303, 309
See application file for complete search history.

(56) References Cited

U.S. PATENT DOCUMENTS

2013/0051563 A1* 2/2013 Kuroki .............. H04S 7/30
                                                 381/17

FOREIGN PATENT DOCUMENTS

JP        2013051595        3/2013

* cited by examiner

*Primary Examiner* — Ammar T Hamid
(74) *Attorney, Agent, or Firm* — JCIPRNET

(57) ABSTRACT

A speaker device includes left and right speakers and a correction part. The correction part corrects frequency characteristics of a stereo audio signal supplied to the left and right speakers so that transfer characteristics of the left and right speakers become predetermined transfer characteristics.

16 Claims, 8 Drawing Sheets

SPEAKER DEVICE AND CONTROL METHOD THEREOF

CROSS-REFERENCE TO RELATED APPLICATION

This application claims the priority benefit of Japan application serial no. 2021-215108, filed on Dec. 28, 2021. The entirety of the above-mentioned patent application is hereby incorporated by reference herein and made a part of this specification.

BACKGROUND

Technical Field

The disclosure relates to a speaker device and a control method thereof.

Related Art

Conventionally, a guitar amplifier has been disclosed to be capable of inputting monaural audio signals (signals of performance sounds of an electric guitar) and stereo audio signals (e.g., audio signals of left and right channels obtained by imparting a stereo effect to the performance sounds of the electric guitar by using an external effector) and include left and right speakers for emitting these audio signals. Further, a technique related to the present application has been disclosed in Patent Document 1 (Japanese Patent Application Laid-Open No. 2013-51595).

SUMMARY

An aspect of the disclosure provides a speaker device including left and right speakers and a correction part. The correction part corrects frequency characteristics of a stereo audio signal to be supplied to the left and right speakers so that transfer characteristics of the left and right speakers become predetermined transfer characteristics.

Another aspect of the disclosure provides a control method of a speaker device, including the following steps. A speaker device including left and right speakers corrects frequency characteristics of an inputted stereo audio signal so that transfer characteristics of the left and right speakers become predetermined transfer characteristics. The speaker device supplies a corrected stereo audio signal to the left and right speakers.

In addition, another aspect of the disclosure provides a speaker device, operable in a monaural mode in which a monaural audio signal is supplied to a plurality of speakers and a stereo mode in which a stereo audio signal is supplied to the plurality of speakers. The speaker device includes a correction part which corrects frequency characteristics of the stereo audio signal so that transfer characteristics of the plurality of speakers in the stereo mode are different from transfer characteristics of the plurality of speakers in the monaural mode.

DESCRIPTION OF THE EMBODIMENTS

Embodiments of the disclosure provide a speaker device which makes it possible to listen to sounds as if emitted from speakers having various characteristics, and a control method thereof.

Hereinafter, embodiments of the disclosure will be described with reference to the drawings. The configuration in the embodiments is exemplary, and the configuration of the embodiments may be appropriately changed without departing from the objective of the disclosure.

Figure 1A:
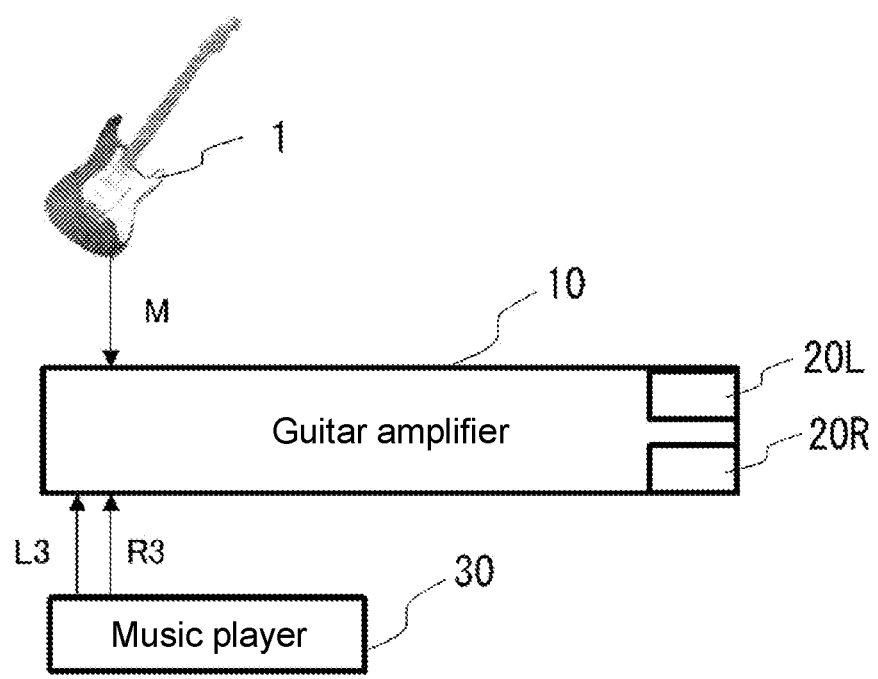
FIG. 1A is a view illustrating a guitar amplifier in a monaural mode.
Figure 1B:
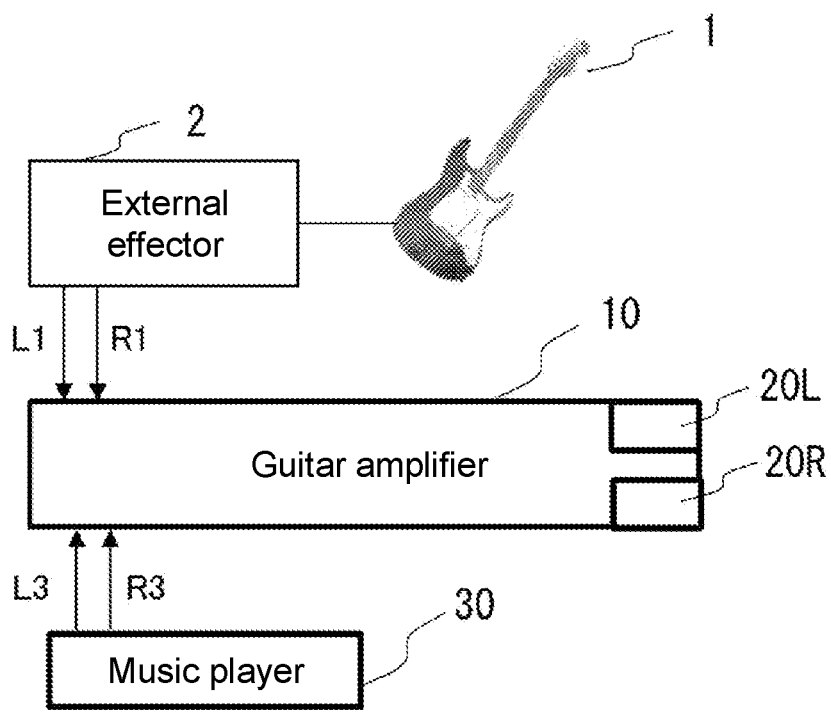
FIG. 1B is a view illustrating the guitar amplifier in a stereo mode.

FIG. 1A is a view illustrating a guitar amplifier in a monaural mode, and FIG. 1B is a view illustrating the guitar amplifier in a stereo mode.

A guitar amplifier 10 according to this embodiment may operate in two modes, i.e., a monaural mode and a stereo mode. As shown in FIG. 1A, in the monaural mode, an electric guitar 1 is directly connected to the guitar amplifier 10, and a monaural audio signal associated with a performance sound of the electric guitar 1 is inputted to the guitar amplifier 10. The guitar amplifier 10 includes a speaker 20L for the left channel (Lch) and a speaker 20R for the right channel (Rch) (left and right speakers 20L and 20R). In the monaural mode, after being amplified, the monaural audio signal is connected to the left and right speakers 20L and 20R, and sounds based on the monaural audio signal are emitted from the speakers 20L and 20R. The speakers 20L and 20R are an example of a plurality of speakers, and the left and right speakers are a form of the plurality of speakers. The plurality of speakers may also include three or more speakers.

As shown in FIG. 1B, in the stereo mode, the electric guitar 1 is connected to an external effector (effect imparting device) 2. A monaural audio signal of a performance sound of the electric guitar 1 is inputted to the external effector 2. By imparting a stereo sound effect such as reverb, delay, and chorus to the monaural audio signal, the external effector 2 generates a stereo audio signal composed of a left channel audio signal and a right channel audio signal and inputs the stereo audio signal to the guitar amplifier 10. In the guitar amplifier 10, after being amplified, the stereo audio signal is connected to the left and right speakers 20L and 20R, and sounds based on the stereo audio signal are emitted. However, the types of sound effects imparted by the external effector 2 are not limited to those illustrated above. The left and right audio signals outputted from the external effector 2 as a stereo audio signal may be the same signal.

Further, a music player 30 is connected to the guitar amplifier 10, and a stereo audio signal outputted from the music player 30 may be inputted to the guitar amplifier 10. In the monaural mode, the stereo audio signal of the music player 30 is synthesized (mixed) with the monaural audio signal, and sounds based on the mixed audio signal are emitted from the speakers 20L and 20R. Accordingly, a user can listen to a sound obtained by mixing a performance sound of his/her own electric guitar 1 and a musical tone of a backing band from the music player 30, for example. Further, in the stereo mode, the stereo audio signal of the music player 30 is synthesized (mixed) with the stereo audio signal from the external effector 2, and sounds based on the mixed audio signal are emitted from the speakers 20L and 20R.

The guitar amplifier 10 in this embodiment is an example of a "speaker device", and the electric guitar 1 is an example of a "musical instrument", and the musical instrument is not limited to a guitar. The speaker device is not limited to a guitar amplifier. The music player 30 is a device capable of inputting a reproduced audio signal of an audio signal of a musical tone or a sound, such as a CD player, an IC recorder, a smartphone, etc., but is not limited to these examples. Also, the source of the monaural audio signal and the stereo audio signal is not specifically limited.

Figure 2:
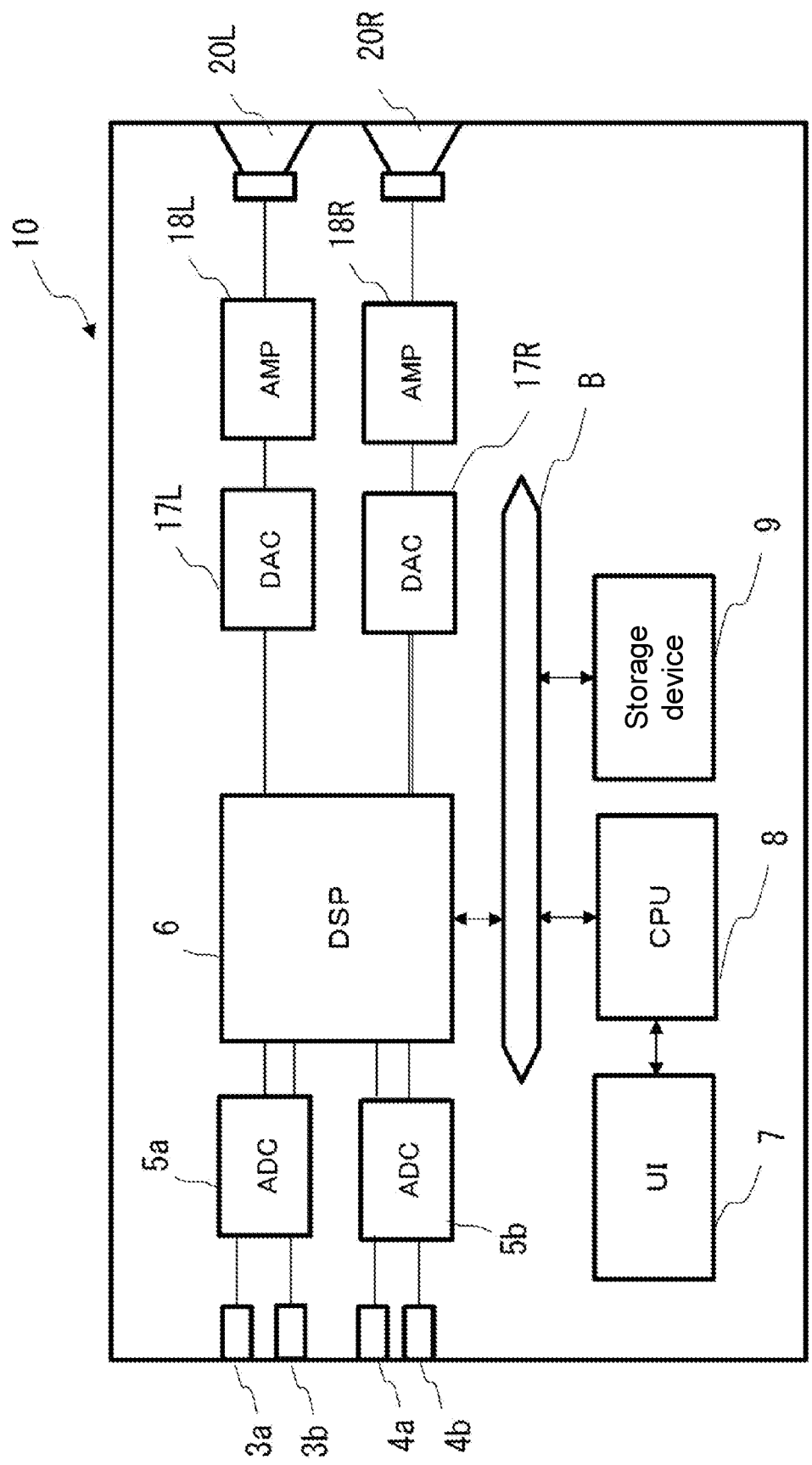
FIG. 2 is a view showing a circuit configuration example of the guitar amplifier.

FIG. 2 is a view showing a circuit configuration example of the guitar amplifier 10. In FIG. 2, the guitar amplifier 10 includes input terminals 3a, 3b, 4a, and 4b, analog digital converters (ADC) 5a and 5b, a digital signal processor (DSP) 6, digital analog converters (DAC) 17L and 17R, amplifiers (AMP) 18L and 18R, and speakers 20L and 20R. The guitar amplifier 10 further includes a central processing unit (CPU) 8 and a storage device 9 connected to the DSP 6 via a bus B, and a user interface (UI) 7 connected to the CPU 8.

The input terminal 3a is used to input a monaural audio signal from the electric guitar 1 or the like in the monaural mode. The input terminals 3a and 3b are used to input stereo audio signals (left and right audio signals) from the external effector 2 or the like. In this embodiment, the input terminal 3a is used both in the monaural mode and in the stereo mode, but it is also possible to provide an input terminal dedicated to the input of monaural audio signals and an input terminal dedicated to the input of stereo audio signals.

The input terminals 4a and 4b are used to input stereo audio signals (left and right audio signals) from an audio signal source such as the music player 30. In the following description, an audio signal inputted using the input terminals 3a and 3b will be referred to as a first stereo audio signal, and an audio signal inputted using the input terminals 4a and 4b will be referred to as a second stereo audio signal.

The ADCs 5a and 5b perform analog-to-digital conversion on inputted audio signals and input the audio signals to the DSP 6. The ADC 5b may be omitted in the case where the second stereo audio signals inputted from the input terminals 4a and 4b are digital signals.

The DSP 6 performs a predetermined audio process on the inputted audio signals and outputs the audio signals to the DACs 17L and 17R. The DACs 17L and 17R perform digital-to-analog conversion on the inputted audio signals. The amplifiers 18L and 18R are power amplifiers which amplify inputted audio signals. The speakers 20L and 20R are accommodated in cabinets and emit sounds based on the inputted audio signals.

The storage device 9 includes a main storage device composed of a random access memory (RAM) and a read only memory (ROM), and an auxiliary storage device such as a hard disk drive (HDD) and a flash memory. The main storage device is used as a program expansion area, a work area for the CPU 8, and a data and program storage area. The auxiliary storage device is used as a data and program storage area.

The UI 7 includes an input device such as a key, a button, a touch panel, a knob, and a slider, and an output device such as a display. The input device is used for inputting data and information. The output device is used for outputting data and information.

The CPU 8 is an example of a processor, and by executing a program, the CPU 8 performs various processes such as overall control of the guitar amplifier 10 and setting of various parameters related to audio processing of the DSP 6.

Figure 3:
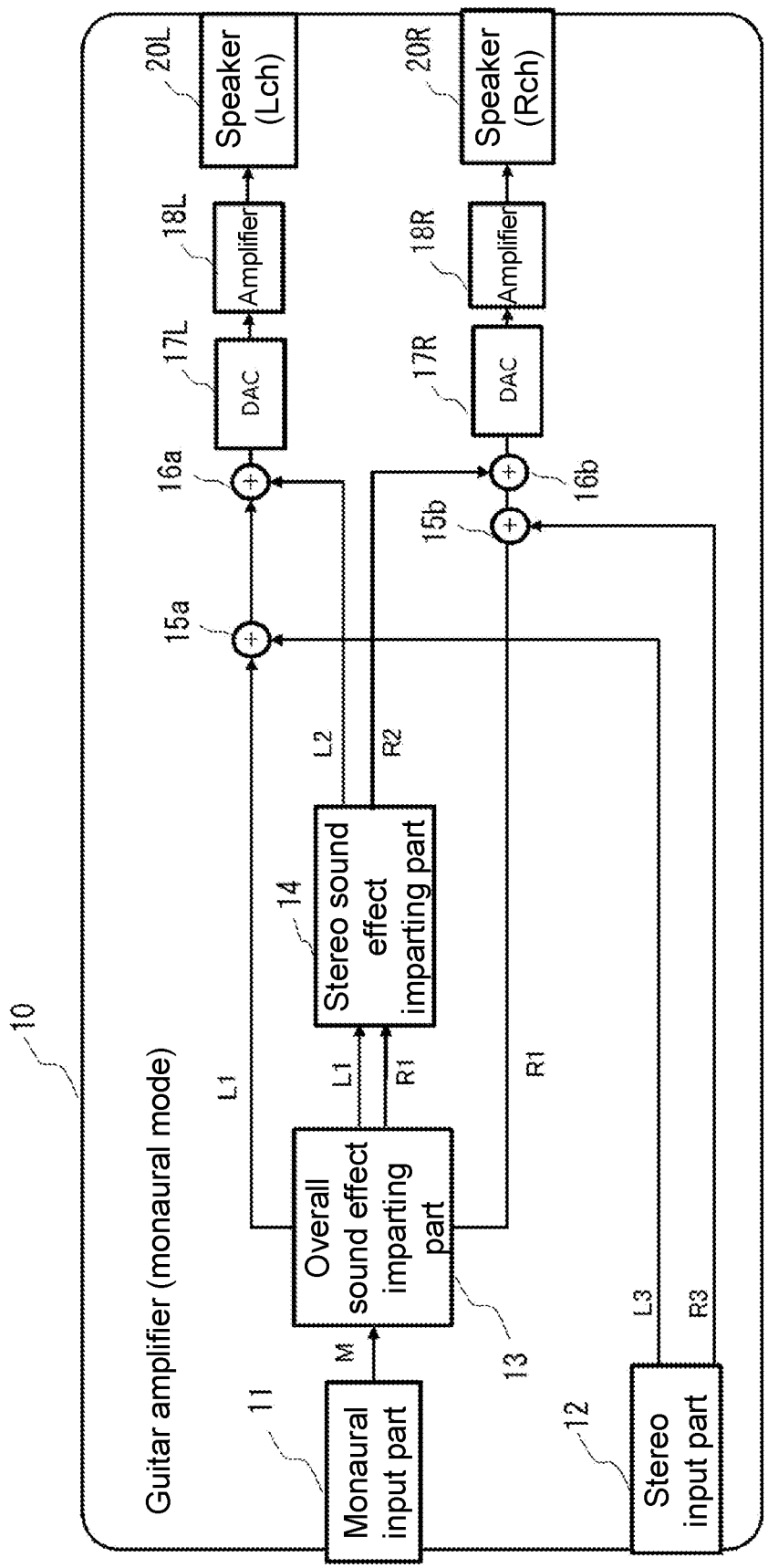
FIG. 3 is a block diagram of the guitar amplifier in the monaural mode.

FIG. 3 is a block diagram of the guitar amplifier 10 in the monaural mode. In the monaural mode, the input terminal 3a and the ADC 5a operate as a monaural input part 11 which performs input and analog-to-digital conversion on a monaural audio signal and outputs a monaural audio signal M in a digital form. Further, the input terminals 4a and 4b and the ADC 5b may operate as a stereo input part 12 which performs input and analog-to-digital conversion on a second stereo audio signal and outputs second stereo audio signals L3 and R3. In the monaural mode, it is not required to input an audio signal to the stereo input part 12. This also applies in the stereo mode.

Further, in the monaural mode, the DSP 6 operates as an overall sound effect imparting part 13, a stereo sound effect imparting part 14, and synthesizing parts (mixers) 15a, 15b, 16a, and 16b.

The overall sound effect imparting part 13 imparts a preset sound effect to the monaural audio signal M inputted from the monaural input part 11. However, there are also cases where the audio signal is passed through with no sound effect being imparted.

The overall sound effect imparting part 13 may output monaural audio signals as audio signals L1 and R1 for the left and right channels. The output destination of the audio signals L1 and R1 may be selected from among the mixers 15a and 15b, the stereo sound effect imparting part 14, and the mixers 16a and 16b.

By imparting a stereo sound effect which creates, for example, a sense of spatial expansion, such as reverb, delay, and chorus, to the audio signals L1 and R1, the stereo sound effect imparting part 14 generates left and right audio signals L2 and R2. The types of sound effects imparted by the stereo sound effect imparting part 14 and the types of sound effects imparted by the overall sound effect imparting part 13 are different. The audio signals L2 and R2 are inputted to the mixers 16a and 16b.

One or both of the overall sound effect imparting part 13 and the stereo sound effect imparting part 14 are an example of a "sound effect imparting part". The overall sound effect imparting part 13 is an example of a first sound effect imparting part, and the stereo sound effect imparting part 14 is an example of a second sound effect imparting part.

The mixer 15a mixes the audio signal L1 from the overall sound effect imparting part 13 and the audio signal L3 outputted from the stereo input part 12. The mixer 15b mixes the audio signal R1 from the overall sound effect imparting part 13 and the audio signal R3 outputted from the stereo input part 12. The mixer 16a mixes the audio signal from the mixer 15a and the audio signal L2 outputted from the stereo sound effect imparting part 14. The mixer 16b mixes the audio signal from the mixer 15b and the audio signal R2 outputted from the stereo sound effect imparting part 14. The output of the mixer 16a is connected to the DAC 17L, and the output of the mixer 16b is connected to the DAC 17R.

The left and right audio signals are converted into an analog form by the DACs 17L and 17R and amplified by the amplifiers 18L and 18R, and sounds based on the left and right audio signals are emitted from the speakers 20L and 20R. The emitted sounds have reverberations (frequency characteristics) corresponding to transfer characteristics specific to the speakers 20L and 20R of the guitar amplifier 10 and the cabinets accommodating the speakers.

Figure 4:
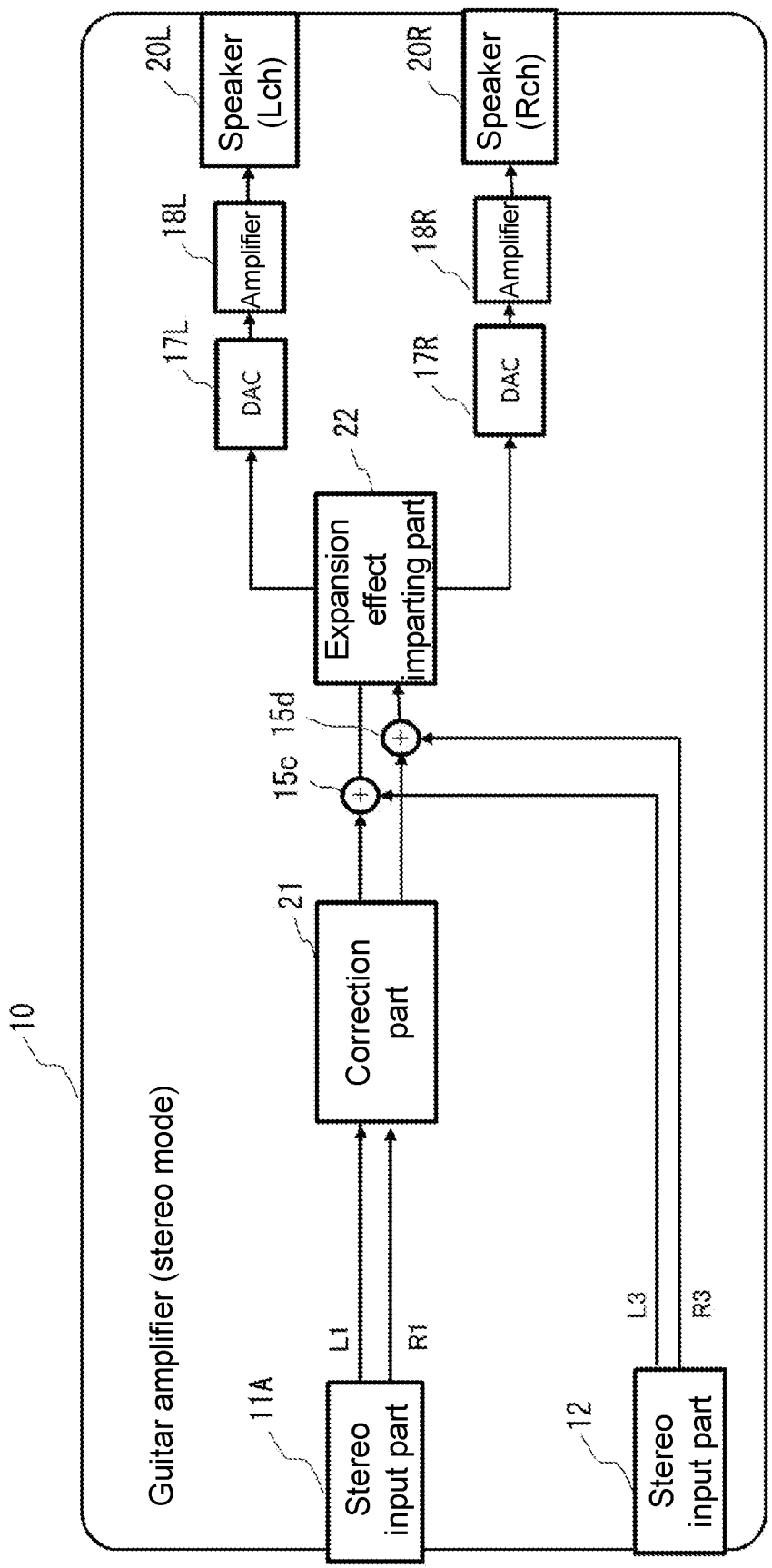
FIG. 4 is a block diagram of the guitar amplifier in the stereo mode.

FIG. 4 is a block diagram of the guitar amplifier in the stereo mode. In the stereo mode, the input terminals 3a and 3b and the ADC 5a operate as a stereo input part 11A. The stereo input part 11A performs analog-to-digital conversion on left and right audio signals (first stereo audio signals) inputted from the input terminals 3a and 3b. First stereo audio signals L1 and R1 are outputted from the stereo input part 11A. The input terminals 4a and 4b and the ADC 5b may operate as a stereo input part 12 and output second stereo audio signals L3 and R3 as in the monaural mode.

Figure 5A:
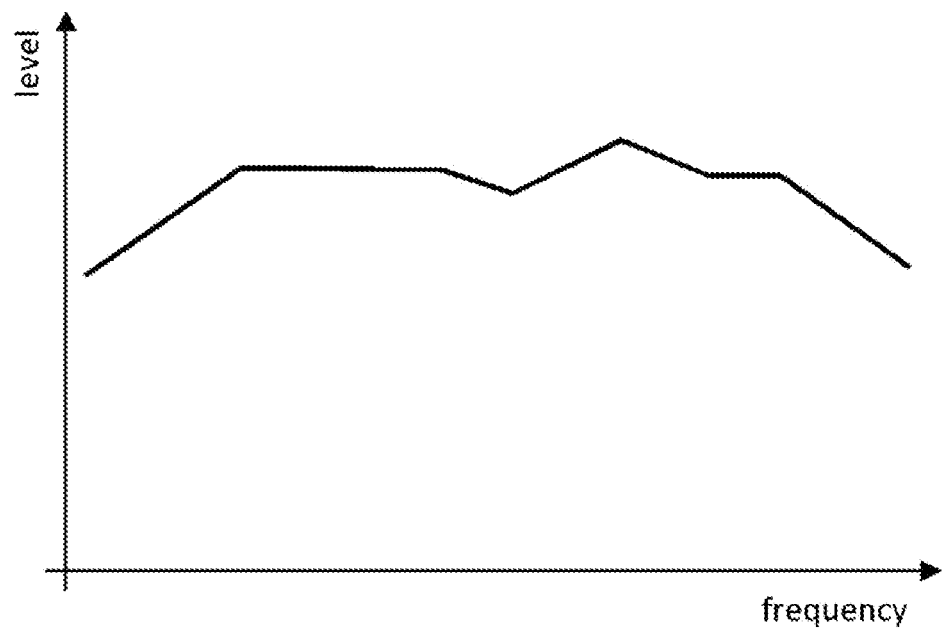
FIG. 5A is a graph schematically showing transfer characteristics (frequency characteristics) of the guitar amplifier in the monaural mode.
Figure 5B:
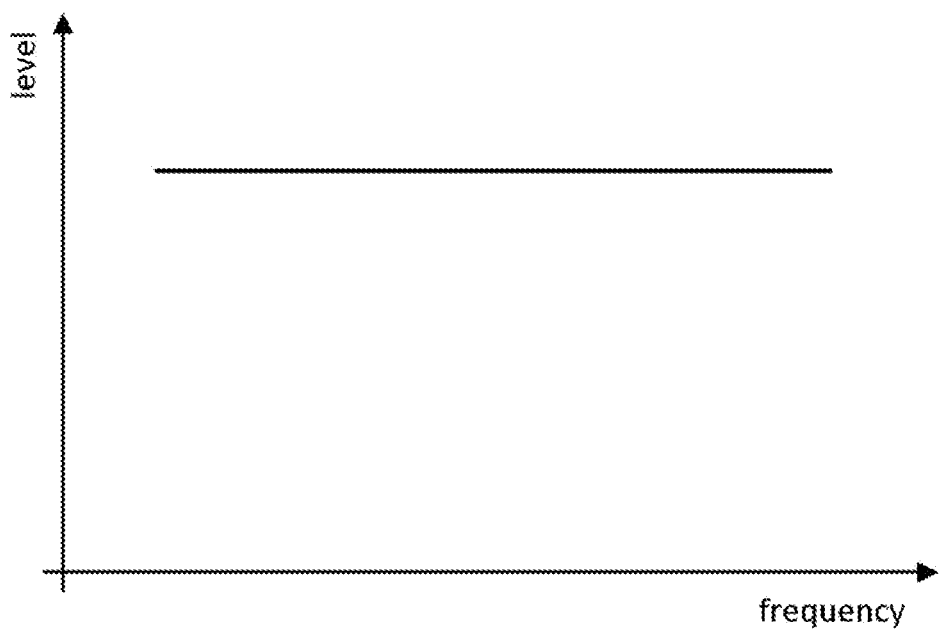
FIG. 5B is a graph schematically showing an example of transfer characteristics of the guitar amplifier in the stereo mode.

In the stereo mode, the DSP 6 operates as a correction part 21 and mixers 15c and 15d. Herein, the transfer characteristics of the speakers 20L and 20R and the cabinets of the guitar amplifier 10 may be expressed as frequency characteristics as shown in FIG. 5A. The correction part 21 performs correction on the inputted first stereo audio signals so that the transfer characteristics of the speakers 20L and 20R and the cabinets are flattened in all frequency bands (e.g., 20 to 20,000 Hz: referred to as a full range) of the audio signal as shown in FIG. 5B. The correction is performed by equalizing or filtering for each frequency band of the first stereo audio signal.

In the external effector 2, a sound effect simulating sound emission from a specific guitar amplifier may be imparted to the sound signal of the electric guitar 1. When sound emission based on the characteristics of the speakers and the cabinets of the guitar amplifier 10 is performed on such first stereo audio signals, there is a possibility that the sound effect applied in the external effector 2 may be impaired or deteriorated. In the correction part 21, audio processing (correction) is performed on the first stereo audio signals so that the characteristics of the speakers and the cabinets of the guitar amplifier 10 are flattened. Accordingly, it becomes possible to output sounds imparted with appropriate sound effects from the speakers 20L and 20R.

Figure 6:
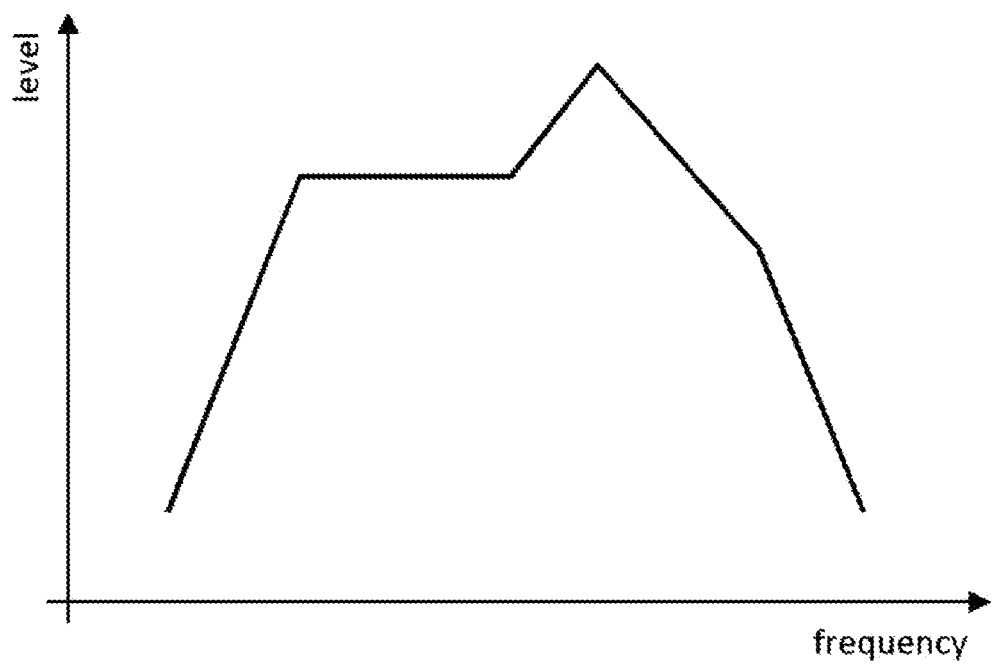
FIG. 6 is a graph schematically showing another example of transfer characteristics of the guitar amplifier in the stereo mode.

However, there is no limitation on the method of correction performed on the first stereo audio signals by the correction part 21. Therefore, for example, the correction part 21 may perform audio processing (correction) on the first stereo audio signals so that the characteristics of the speakers and the cabinets of the guitar amplifier 10 become characteristics of a specific guitar amplifier different from the guitar amplifier 10, as shown in FIG. 6. Accordingly, it becomes possible to emit, from the speakers 20L and 20R, sounds generated as if using a specific guitar amplifier. In this manner, the correction part 21 can correct audio signals so that the speakers 20L and 20R and the cabinets have desired characteristics.

In the case where the second stereo audio signals are inputted, the mixers 15c and 15d mix the left and right audio signals outputted from the correction part 21 and the second stereo audio signals L3 and R3.

Figure 7:
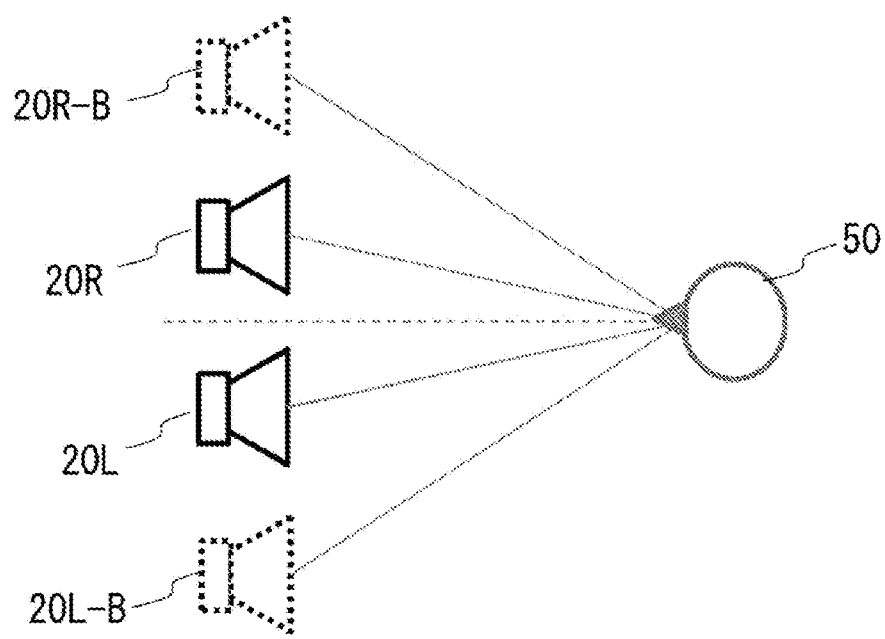
FIG. 7 is a view illustrating imparting an expansion effect.

The expansion effect imparting part 22 performs signal processing on the left and right audio signals outputted from the mixers 15c and 15d to impart a sound image expansion effect to audio signals to be supplied to the speakers 20L and 20R. Accordingly, as shown in FIG. 7, a range of a localizable sound image perceivable by a listener 50 can be expanded from between the speakers 20L and 20R to, for example, between virtual speakers 20L-B and 20R-B.

Various known techniques such as crosstalk cancellation and techniques using HRTF may be applied as the signal processing for imparting a sound image expansion effect. The signal processing for imparting a sound image expansion effect may be realized by using a delay circuit, a finite impulse response (FIR) filter, etc.

The configurations of the DACs 17L and 17R, the amplifiers 18L and 18R, and the speakers 20L and 20R in the stereo mode are the same as in the monaural mode. With the configurations shown in FIG. 4, the expansion effect can be imparted to both the first stereo audio signals and the second stereo audio signals.

Figure 8:
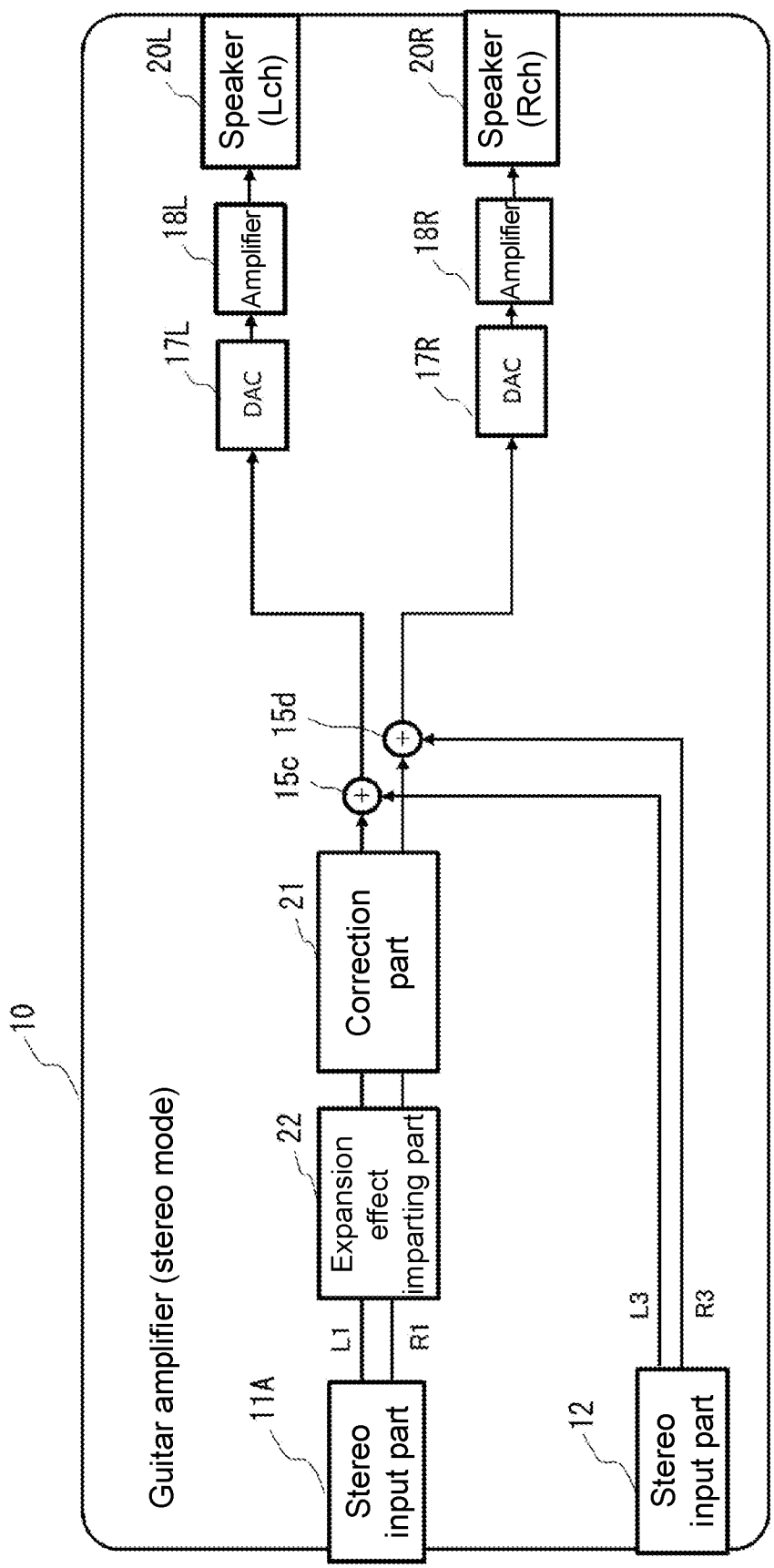
FIG. 8 is a view showing a modification example of the block diagram shown in FIG. 4.
Figure 9:
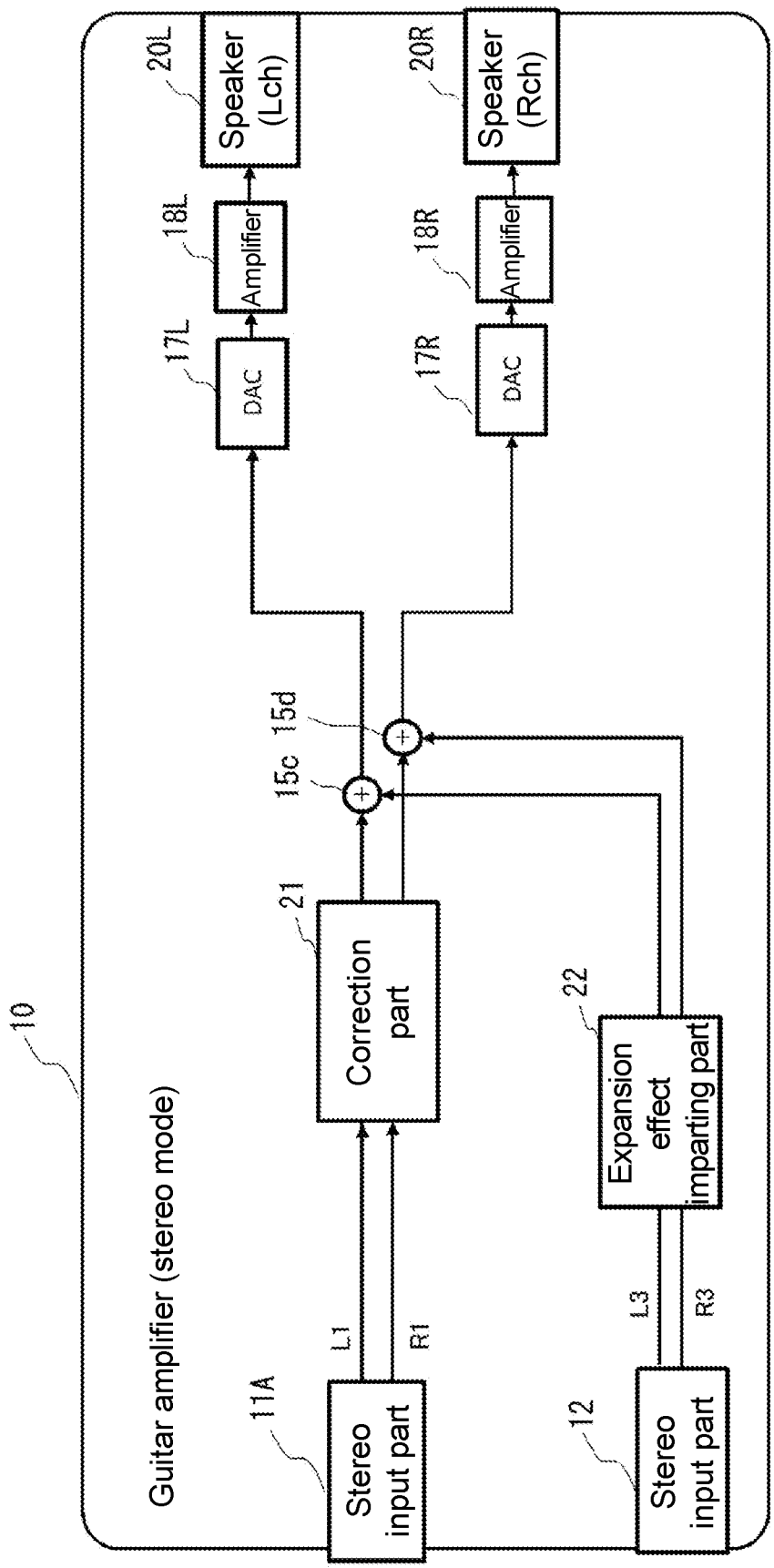
FIG. 9 is a view showing a modification example of the block diagram shown in FIG. 4.

FIG. 8 is a modification view of the block diagram shown in FIG. 4. FIG. 9 is a modification view of the block diagram shown in FIG. 4. As shown in FIG. 8, the expansion effect imparting part 22 may be inserted between the stereo input part 11A and the correction part 21 to impart an expansion effect to the first stereo audio signals. Alternatively, as shown in FIG. 9, the expansion effect imparting part 22 may be inserted between the stereo input part 12 and the mixers 15c and 15d to impart an expansion effect to the second stereo audio signals.

A switch from the monaural mode to the stereo mode and vice versa are performed by operating the UI 7. When the monaural mode is switched to the stereo mode, the overall sound effect imparting part 13 and the stereo sound effect imparting part 14 in the DSP 6 are automatically turned off.

The guitar amplifier 10 (speaker device) according to the embodiment includes the left and right speakers 20L and 20R and the correction part 21. The correction part 21 corrects frequency characteristics of a stereo audio signal (first stereo audio signal) to be supplied to the left and right speakers 20L and 20R so that transfer characteristics of the left and right speakers 20L and 20R become predetermined transfer characteristics.

The correction part 21 corrects the stereo audio signal so that the transfer characteristics of the left and right speakers 20L and 20R become different from the transfer characteristics of the left and right speakers 20L and 20R of a case where a monaural audio signal is supplied to the left and right speakers 20L and 20R. With the correction of the frequency characteristics performed by the correction part 21, it is possible to listen to sounds as if emitted from speakers having transfer characteristics different from the transfer characteristics of the speakers 20L and 20R and their cabinets. Therefore, according to the guitar amplifier 10 serving as a speaker device according to the embodiment, it is possible to listen to sounds as if emitted from speakers having various characteristics.

The correction part 21 may correct the stereo audio signal so that the transfer characteristics of the left and right speakers 20L and 20R are flattened across all audio signal frequencies (e.g., 20 to 20,000 Hz) (see FIG. 5B). Accordingly, it is possible to emit sounds from the speakers 20L and 20R without impairing the sound effect imparted in the external effector 2.

Further, the correction part 21 may correct the stereo audio signal so that the transfer characteristics of the left and right speakers 20L and 20R become transfer characteristics of speakers of a type different from the left and right speakers (see FIG. 6). Accordingly, it is possible to emit, from the speakers 20L and 20R, sounds having characteristics of a guitar amplifier other than the guitar amplifier 10.

The guitar amplifier 10 may further include the expansion effect imparting part 22 which imparts a sound image expansion effect to a stereo audio signal before being corrected by the correction part 21 or a stereo audio signal after being corrected by the correction part 21, so that a range of a localizable sound image is expanded beyond an interval between the left and right speakers 20L and 20R. Accordingly, it is possible to perform suitable audio listening in the form of speakers.

The expansion effect imparting part 22 may impart a sound image expansion effect to a second stereo audio signal to be synthesized with a first stereo audio signal which is the stereo audio signal. Further, the expansion effect imparting part 22 may impart a sound image expansion effect to an audio signal obtained by synthesizing a first stereo audio signal and a second stereo audio signal.

The guitar amplifier 10 may include a sound effect imparting part which imparts a sound effect to a monaural audio signal in the monaural mode in which a monaural audio signal is supplied to the left and right speakers 20L and 20R. The sound effect imparting part may include, for example, at least one of the overall sound effect imparting part 13 (an example of a first sound effect imparting part) which imparts a sound effect to an inputted monaural audio signal, and the stereo sound effect imparting part 14 (an example of a second sound effect imparting part) which imparts a stereo sound effect to an inputted monaural audio signal. The sound effect imparting part may be configured to be turned off in the case where the monaural mode transitions to the stereo mode in which a stereo audio signal is supplied to the left and right speakers.

Further, according to an embodiment, it is possible to provide a control method of a speaker device in which a speaker device including the left and right speakers 20L and 20R corrects frequency characteristics of an inputted stereo audio signal so that transfer characteristics of the left and right speakers 20L and 20R become predetermined transfer characteristics, and provides the corrected stereo audio signal to the left and right speakers 20L and 20R.

Further, according to an embodiment, it is possible to provide a speaker device operable in a monaural mode in which a monaural audio signal is supplied to a plurality of speakers 20L and 20R and a stereo mode in which a stereo audio signal is supplied to the plurality of speakers 20L and 20R. The speaker device includes a correction part 21 which corrects frequency characteristics of the stereo audio signal so that transfer characteristics of the plurality of speakers 20L and 20R in the stereo mode are different from transfer characteristics of the plurality of speakers 20L and 20R in the monaural mode. The configurations shown in the embodiments may be appropriately combined without departing from the objective.

What is claimed is:

1. A speaker device comprising:
   left and right speakers; and
   a correction part which corrects frequency characteristics of a stereo audio signal to be supplied to the left and right speakers so that transfer characteristics of the left and right speakers become predetermined transfer characteristics, wherein the correction part corrects the stereo audio signal so that the transfer characteristics of the left and right speakers are flattened across all audio signal frequencies.

2. The speaker device according to claim 1, wherein the correction part corrects the stereo audio signal so that the transfer characteristics of the left and right speakers are different from transfer characteristics of the left and right speakers of a case in which a monaural audio signal is supplied to the left and right speakers.

3. The speaker device according to claim 1, wherein the correction part corrects the stereo audio signal so that the transfer characteristics of the left and right speakers become transfer characteristics of speakers of a type different from the left and right speakers.

4. The speaker device according to claim 1, further comprising:
   an expansion effect imparting part which imparts a sound image expansion effect to a stereo audio signal before being corrected by the correction part, so that a range of a localizable sound image is expanded beyond an interval between the left and right speakers.

5. The speaker device according to claim 1, further comprising:
   an expansion effect imparting part which imparts a sound image expansion effect to a stereo audio signal having been corrected by the correction part, so that a range of a localizable sound image is expanded beyond an interval between the left and right speakers.

6. The speaker device according to claim 1, further comprising:
   an expansion effect imparting part which imparts a sound image expansion effect to a second stereo audio signal to be synthesized with a first stereo audio signal which is the stereo audio signal, so that a range of a localizable sound image is expanded beyond an interval between the left and right speakers.

7. The speaker device according to claim 1, further comprising:
   an expansion effect imparting part which imparts a sound image expansion effect to an audio signal obtained by synthesizing a first stereo audio signal which is the stereo audio signal and a second stereo audio signal which is different from the first stereo audio signal, so that a range of a localizable sound image is expanded beyond an interval between the left and right speakers.

8. The speaker device according to claim 1, further comprising:
   a sound effect imparting part which imparts a sound effect to a monaural audio signal in a monaural mode in which a monaural audio signal is supplied to the left and right speakers.

9. The speaker device according to claim 8, wherein the sound effect imparting part comprises at least one of a first sound effect imparting part which imparts a sound effect to an inputted monaural audio signal, and a second sound effect imparting part which imparts a stereo sound effect to the inputted monaural audio signal.

10. The speaker device according to claim 8, wherein the sound effect imparting part is turned off in a case where the monaural mode transitions to a stereo mode in which a stereo audio signal is supplied to the left and right speakers.

11. A control method of a speaker device, comprising:
    correcting, by a speaker device comprising left and right speakers, frequency characteristics of an inputted stereo audio signal so that transfer characteristics of the left and right speakers become predetermined transfer characteristics, wherein the transfer characteristics of the left and right speakers are flattened across all audio signal frequencies; and
    supplying, by the speaker device, a corrected stereo audio signal to the left and right speakers.

12. A speaker device, operable in a monaural mode in which a monaural audio signal is supplied to a plurality of speakers and a stereo mode in which a stereo audio signal is supplied to the plurality of speakers, the speaker device comprising:

a correction part which corrects frequency characteristics of the stereo audio signal so that transfer characteristics of the plurality of speakers in the stereo mode are different from transfer characteristics of the plurality of speakers in the monaural mode, wherein the correction part corrects the stereo audio signal so that the transfer characteristics of the left and right speakers are flattened across all audio signal frequencies.

13. The speaker device according to claim 12, further comprising:
    an expansion effect imparting part which imparts a sound image expansion effect to a stereo audio signal before being corrected by the correction part, so that a range of a localizable sound image is expanded beyond an interval between the plurality of speakers.

14. The speaker device according to claim 12, further comprising:
    an expansion effect imparting part which imparts a sound image expansion effect to a stereo audio signal having been corrected by the correction part, so that a range of a localizable sound image is expanded beyond an interval between the plurality of speakers.

15. The speaker device according to claim 12, further comprising:
    an expansion effect imparting part which imparts a sound image expansion effect to a second stereo audio signal to be synthesized with a first stereo audio signal which is the stereo audio signal, so that a range of a localizable sound image is expanded beyond an interval between the plurality of speakers.

16. The speaker device according to claim 12, further comprising:
    an expansion effect imparting part which imparts a sound image expansion effect to an audio signal obtained by synthesizing a first stereo audio signal which is the stereo audio signal and a second stereo audio signal which is different from the first stereo audio signal, so that a range of a localizable sound image is expanded beyond an interval between the plurality of speakers.

\* \* \* \* \*